United States Patent [19]
Kang

[11] Patent Number: 5,834,798
[45] Date of Patent: *Nov. 10, 1998

[54] SEMICONDUCTOR DEVICE CONTAINING SEMICONDUCTOR REGION FORMED IN ACTIVE LAYER ON SIDEWALL OF CONTACT OPENING

[75] Inventor: Seen Suk Kang, Seoul, Rep. of Korea

[73] Assignee: LG Semicon Co., Ltd., Chungcheonqbuk-do, Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 773,088

[22] Filed: Dec. 24, 1996

[30] Foreign Application Priority Data

Dec. 26, 1995 [KR] Rep. of Korea .................. 1995 56307

[51] Int. Cl.$^6$ ..................................................... H01L 29/76
[52] U.S. Cl. .............................. 257/67; 257/69; 257/328; 257/368
[58] Field of Search ................................ 257/67, 69, 328, 257/329, 368

[56] References Cited

U.S. PATENT DOCUMENTS

| | | | |
|---|---|---|---|
| 5,229,310 | 7/1993 | Sivan | 437/41 |
| 5,241,193 | 8/1993 | Pfiester et al. | 257/67 |
| 5,349,205 | 9/1994 | Kobayashi et al. | 257/59 |

OTHER PUBLICATIONS

C.T. Liu, et al., High Reliability and High Performance 0.35μm Gate–Inverted TFT's for 16Mbit SRAM Applications Using Self–Aligned LDD Structures, IEEE, pp.32.7.1 –327.7.4, 1992.

*Primary Examiner*—Olik Chaudhuri
*Assistant Examiner*—Douglas A. Wille
*Attorney, Agent, or Firm*—Finnegan, Henderson, Farabow, Garrett & Dunner, L.L.P.

[57] ABSTRACT

A semiconductor device is disclosed including a first insulating film having a contact hole and being formed on a substrate. A first impurity region is formed in the active layer on the bottom of the contact hole, and a second impurity region is formed in the active layer on the first insulating film outside the contact hole. In addition, a semiconductor region is formed in the active layer on the sidewall of the contact hole, and a second insulating film is formed on the first impurity region in the contact hole. A gate electrode is formed on the second insulating film.

13 Claims, 7 Drawing Sheets prior.art prior.art

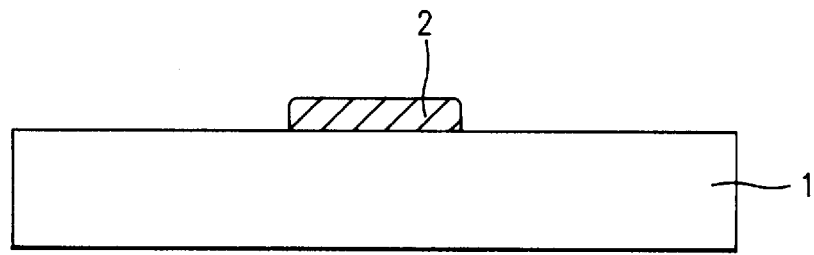
FIG.3A prior.art
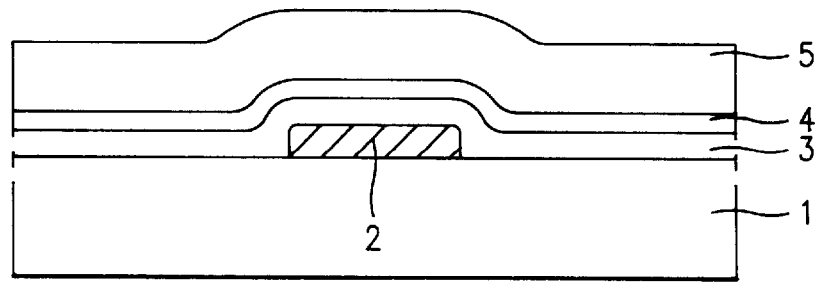
FIG.3B prior.art
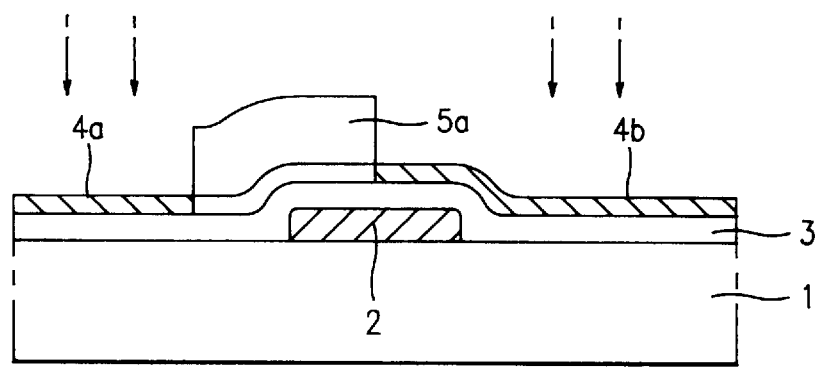
FIG.3C prior.art
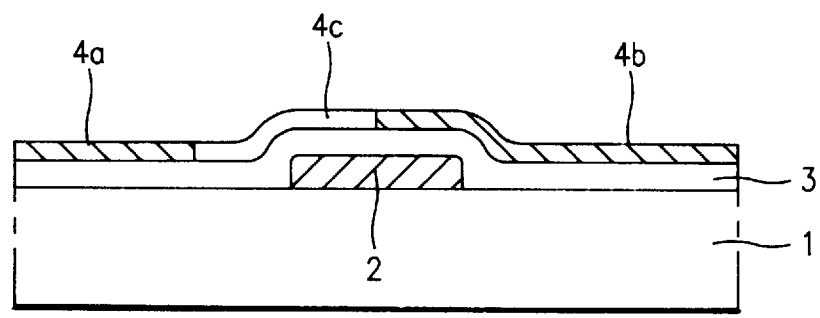
FIG.3D prior.art 5,834,798

SEMICONDUCTOR DEVICE CONTAINING SEMICONDUCTOR REGION FORMED IN ACTIVE LAYER ON SIDEWALL OF CONTACT OPENING

BACKGROUND OF THE INVENTION

The present invention relates to a semiconductor device and a related fabrication method. More particularly, the present invention is directed to a semiconductor device having a reduced size suitable for incorporation into a high density integrated circuit on an offset region which is easily controlled.

As shown in FIG. 1, a static random access memory (SRAM) cell can include four N-channel metal oxide semiconductor (NMOS) transistors T3 to T6 and two P-channel metal oxide semiconductor (PMOS) thin film transistors T1 and T2. Generally, the four NMOS transistors T3 to T6 are formed on the semiconductor substrate and the two PMOS transistors T1 and T2 are formed on the NMOS transistors as thin film transistors. Additionally, as further shown in FIG. 1, power supply Vcc is coupled to sources S1 and S2 of transistors T1 and T2, respectively. WC designates a word line and BL and BC represent bit lines for accessing the same cell. Each of transistors T1 to T6 respectively includes sources S1 to S6, gates G1 to G6 and drain electrodes D1 to D6.

A typical SRAM cell having the above-described construction has a relatively large size because the four NMOS and PMOS transistors are laterally disposed near one another on the surface of the substrate. Thus, it is difficult to implement this type of memory cell in a high density memory. Accordingly, in order to fabricate a high-density SRAM cell having densities exceeding 16M, efforts have been made to fabricate smaller transistors.

Accordingly, a conventional transistor having reduced size has been proposed. FIG. 2 shows a cross sectional view of this device.

As shown in FIG. 2, the conventional semiconductor device comprises a substrate 1 and a gate electrode 2 formed thereon. A gate insulating film 3 is provided on the gate electrode 2 and portions of substrate 1 not covered by gate electrode 2. Next, a semiconductor layer including a first impurity region 4a, laterally spaced from gate electrode 2, is provided on gate insulating film 3. The semiconductor layer further includes a second impurity region 4b partially overlapping gate electrode 2 and an offset region 4c formed between the first impurity region 4a and the second impurity region 4b.

A method for fabricating the above-described conventional semiconductor device will now be described with reference to FIGS. 3A–3D.

As shown in FIG. 3A, a metal layer is first deposited on substrate 1 and patterned to form gate electrode 2 using a conventional photolithography process. Next, as shown in FIG. 3B, gate insulating film 3 is deposited on the entire surface of substrate 1 including the gate electrode 2. A polycrystalline active layer 4 and a photosensitive film 5 are then successively deposited on insulating film 3.

As illustrated in FIG. 3C, an offset region is designated by selectively exposing and developing film 5 using an additional offset mask. First and second impurity regions 4a and 4b are formed spaced from one another by implanting a non-volatile ion into the active layer 4 using the patterned photosensitive film 5a as a mask. Lastly, as shown in FIG. 3D, the patterned photosensitive film 5 is selectively removed, leaving portion 4c of active layer 4, covered by film 5a, as an offset region.

An SRAM cell incorporating the above-described conventional semiconductor device will now be described.

FIG. 4 is a cross sectional view illustrating an example of how the conventional semiconductor device described above is incorporated into an SRAM cell. Specifically, FIG. 4 illustrates a bulk transistor and a thin film transistor corresponding to transistors T3 and T2 shown in part A of FIG. 1.

As seen in FIG. 4, a field oxide film 12 is provided to define a field region and an active region on the semiconductor substrate 11. First, gate insulating film 13 is formed on an active region of substrate 11 in isolated relation to the field region, and first gate electrode 14 is formed on the second gate insulating film 13. A sidewall insulating film 16 is formed on both sidewalls of the first gate electrode 14, and first and second impurity regions 17 and 18 are formed in the substrate 11 adjacent respective sidewall insulating films 16.

An interlevel insulating film 21 is formed on the substrate and includes an opening exposing first gate electrode 14. A second gate electrode 22 is formed on the interlevel insulating film 21 and a second gate insulating film 23 is formed on the interlevel insulating film 21 including the second gate electrode 22, except the exposed surface of the first gate electrode 14. Third and fourth impurity regions 24a and 24b are formed spaced from one another on the second gate insulating film 23, and an offset region 24c is formed therebetween. Thus, the bulk transistor includes the first gate insulating film 13, the first gate electrode 14 and the first and second impurity regions 17 and 18, and the thin film transistor includes the third and fourth impurity regions 24a and 24b, the semiconductor region 24c, the second gate insulating film 23, and the second gate electrode 22. The bulk transistor and the thin film transistor are connected electrically by coupling the first gate electrode 14 to the third impurity region 24a.

A method for fabricating the above-described transistor cell will now be described.

A field oxide film 12 is first deposited on substrate 11 defining a field region and an active region using a field oxide process.

Metal is then deposited on a portion of insulating material corresponding to the active region, but not the field region.

The insulating material is then selectively removed using a photolithography and photo-etching process to form the first gate insulating film 13 and the first gate electrode 14. Next, a low concentration impurity ion is implanted on opposite sides of the active region of the semiconductor substrate 11 using the first gate electrode 14 as a mask, thereby forming low concentration impurity concentration LDD regions.

An insulating material is then deposited on the entire semiconductor substrate 11 including the first gate electrode 14, followed by selective removal of the insulating material so that sidewall portions 16 remain on the sides of the first gate electrode 14 and the first gate insulating film 13. Thereafter, high concentration impurity ions ($n^+$) are implanted into the active region of the semiconductor substrate 11 using sidewalls 16 and the first gate electrode 14 as a mask. As a result, the first and second impurity regions 17 and 18 are formed in connection with the low concentration impurity region 15. The first impurity region 17 is used as a source region of the bulk transistor, and the second impurity region 18 is used as a drain region. An insulating material is deposited over the entire substrate surface to form the interlevel insulating film 21. Portions of interlevel insulating film 21 are then selectively removed using a conventional photolithography process to form a contact hole to expose the first gate electrode 14. A metal layer is then deposited on the entire surface of the interlevel insulating film 21 including the contact hole, and the metal is selectively removed using photolithography to form the second gate electrode 22.

The second gate insulating film 23 is then formed by depositing insulating material on the interlevel insulating film 21 including the second gate electrode 22. Next, polycrystalline silicon is deposited on the interlevel insulating film 21 including the exposed surface of the first gate electrode 14 and the second gate insulating film 23 to form the active film 24. A photosensitive film is then coated onto the substrate and patterned by an exposure and development process using an additional offset mask as illustrated in FIG. 3C to define the offset region on the active film 24. Impurity ions are then implanted into the active film 24 using the patterned photosensitive film as a mask. As a result, third and fourth impurity regions 24a and 24b are formed spaced from one another by offset region 24c. The sensitive film remaining on the offset region is then removed.

However, the conventional semiconductor device employed in an SRAM cell has problems. First, additional masks are needed to form the offset region and the gate electrode of the transistor. Accordingly, the number of fabrication steps is increased, and the overall process becomes complicated. Second, it is hard to accurately align the offset region and the gate electrode from device to device. Therefore, the offset region and the gate electrode become less uniform. Third, by forming the impurity regions laterally spaced from one another, the size of the transistor on the substrate is increased. That is, in the SRAM cell of the conventional semiconductor device, when the thin film transistor is deposited on the bulk transistor, the size of the transistor unit is increased, and it is not suitable for use in a high density memory circuit.

SUMMARY OF THE INVENTION

An object of the present invention is to solve the problems of the prior art and to provide a semiconductor device suitable for incorporation in a high density memory circuit.

A further object is to easily control the offset region, thereby increasing device uniformity and simplifying the fabrication process.

Another object of the present invention is to provide a semiconductor device which is suitable for incorporation into a high density memory device by reducing the lateral dimensions of the transistor on the substrate surface.

In order to achieve these objects, the present invention comprises: a substrate; a first insulating film having a contact hole formed on the substrate; a first impurity region formed on the bottom of the contact hole; a second impurity region formed on the first insulating film except in the contact hole; a semiconductor region formed on the sidewall of the contact hole; a second insulating film formed on the first impurity region in the contact hole; and a gate electrode formed on the second insulating film.

A fabrication method of the semiconductor device according to the present invention comprises the steps of: providing a substrate; forming on the substrate a first insulating film having a contact hole; implanting impurity ions into an active region formed on the first insulating film, except for the contact hole and the bottom of the contact hole; forming separate first and second impurity regions; forming a second insulating film on the first impurity region formed on the bottom of the contact hole; and forming a gate electrode on the second insulating film in the contact hole.

BRIEF DESCRIPTION OF THE DRAWINGS

FIGS. 3A to 3D are cross sectional views illustrating fabrication steps of a conventional method for manufacturing the device shown in FIG. 2;

DETAILED DESCRIPTION OF THE PREFERRED EMBODIMENTS

A semiconductor device according to the present invention will now be described below in detailed with reference to the attached drawings.

Figure 1:
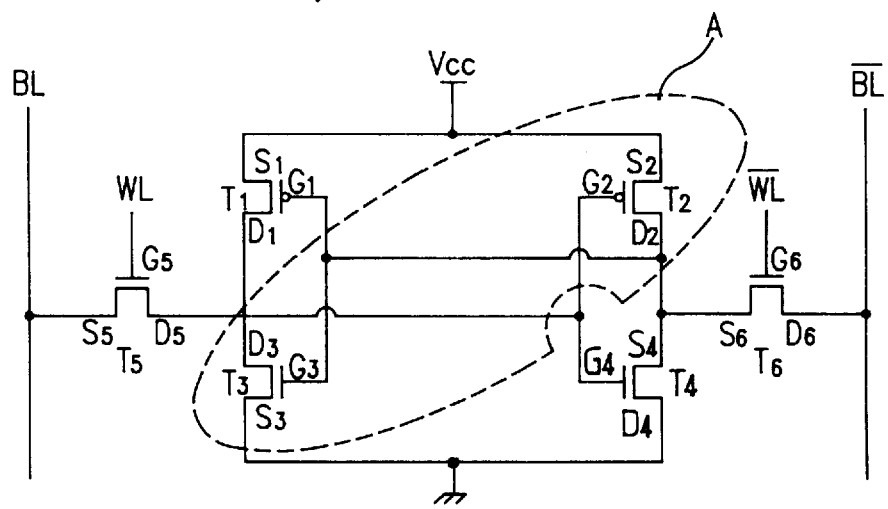
FIG. 1 is a schematic diagram illustrating the structure of a conventional static random access memory cell.
Figure 2:
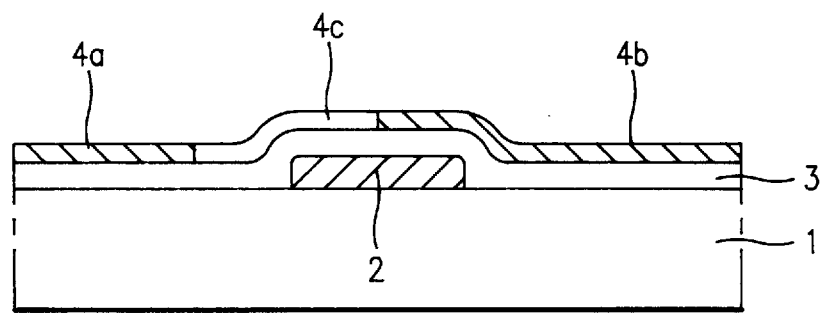
FIG. 2 is a cross sectional view of a conventional semiconductor device.
Figure 4:
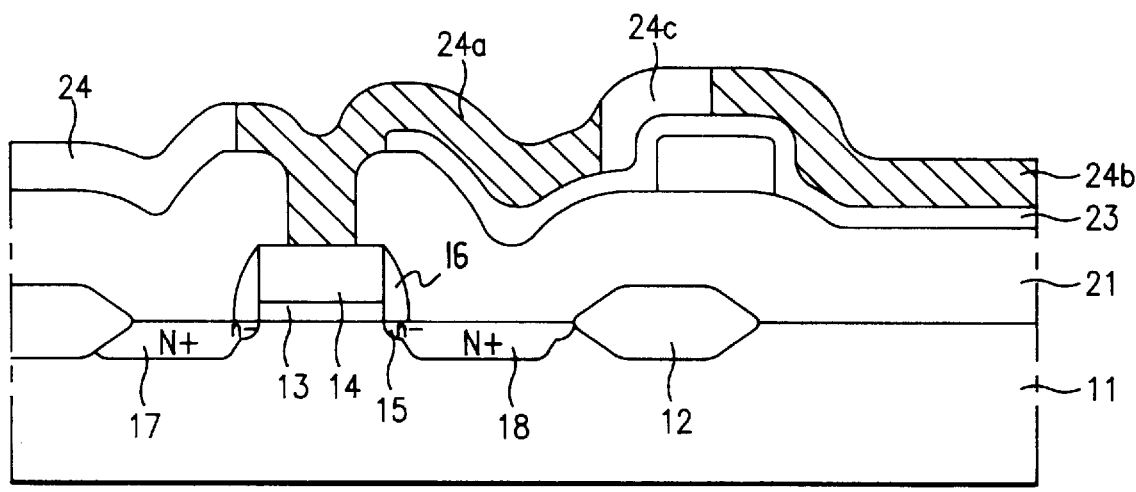
FIG. 4 is a cross sectional view of a portion of a conventional SRAM cell corresponding to part A shown in FIG. 1.
Figure 5:
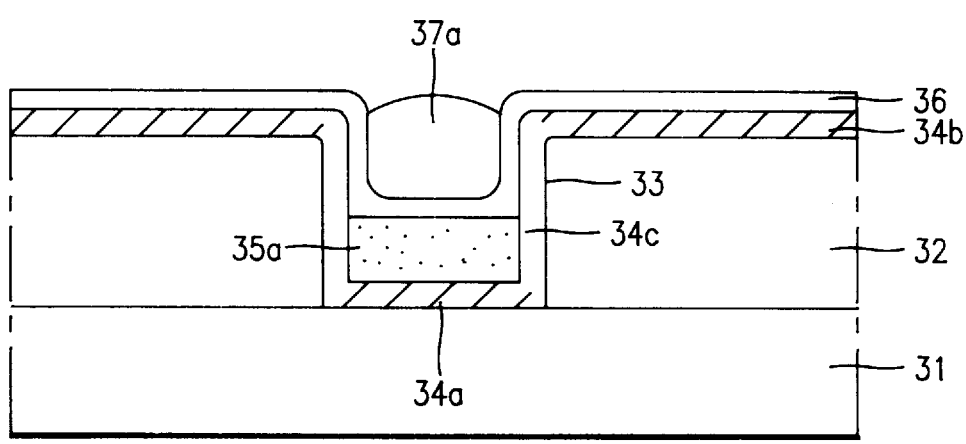
FIG. 5 is a cross sectional view of a semiconductor device according to a preferred embodiment of the present invention.

As illustrated in FIG. 5, a semiconductor device, in accordance with the present invention, comprises a first insulating film 32 having a contact hole 33 formed on the substrate 31. First impurity region 34a is formed on the bottom of the contact hole 33, and a second impurity region 34b is formed on the first insulating film 32, except in contact hole 33. A semiconductor region 34c is formed in the sidewall of the contact hole 33, and a second insulating film 35a is formed on the first impurity region 34a at the bottom of the contact hole 33.

A third insulating film 36 is formed on the semiconductor region 34a, including the second insulating film 35a and the second impurity region 34b, and a gate electrode 37a is formed on the third insulating film 36 in contact hole 33.

The second insulating film 35a is formed thinner than the depth of the contact hole 33. In addition, the body of the transistor is formed inside the contact hole 33 and is typically cylindrical. The first impurity region 34a typically constitutes a drain region and the second impurity region 34b a source. Semiconductor region 34c is a channel region and is formed between and perpendicular to the first and second impurity regions 34a and 34b. Further, a portion of semiconductor region 34c abutting the second insulating film 35a serves as an offset region.

A method for fabricating the semiconductor device in accordance with the present invention will now be described.

Figure 6A:
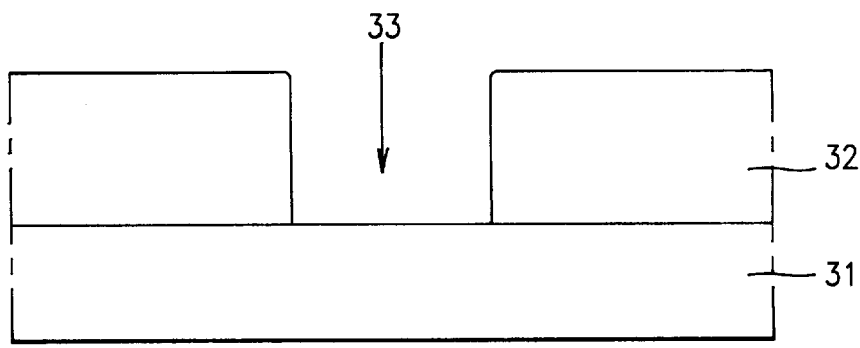
FIGS. 6A to 6H show various stages of a fabrication process in accordance with the present invention for manufacturing the device shown in FIG. 5.

As illustrated in FIG. 6A, an insulating material is deposited on the substrate 31 to form the first insulating film 32, which is then patterned using a photolithography process to form the contact hole 33.

Figure 6B:
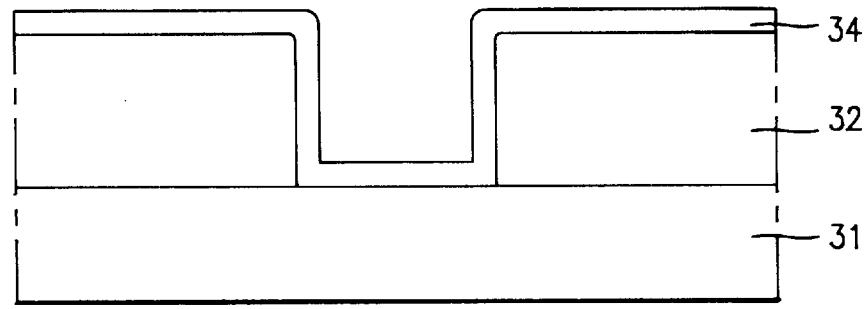

Polycrystalline silicon is next deposited on the first insulating film 43 including the contact hole 33, as illustrated in FIG. 6B, to form active film 34.

Figure 6C:
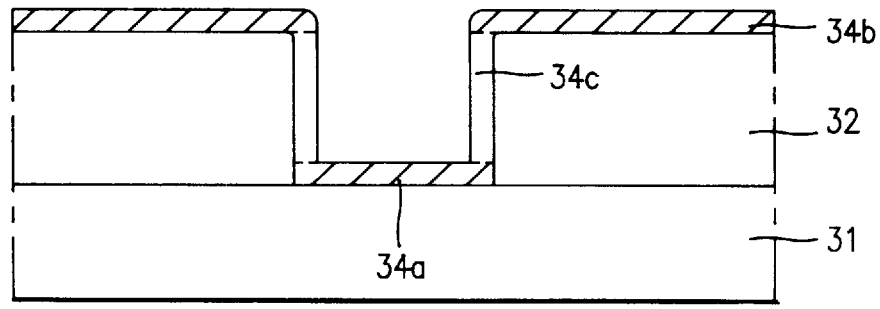

As illustrated in FIG. 6C, impurity ions are implanted into active film 34 to form the first impurity region 34a on the bottom of the contact hole 33, and thereafter the second impurity region 34b is formed in the active film formed on a top surface of first insulating film 32, but not on the sidewall of contact hole 33. As a result, a semiconductor region 34c is formed on the sidewall of contact hole 33, namely the part in which the impurity ions are not implanted.

Figure 6D:
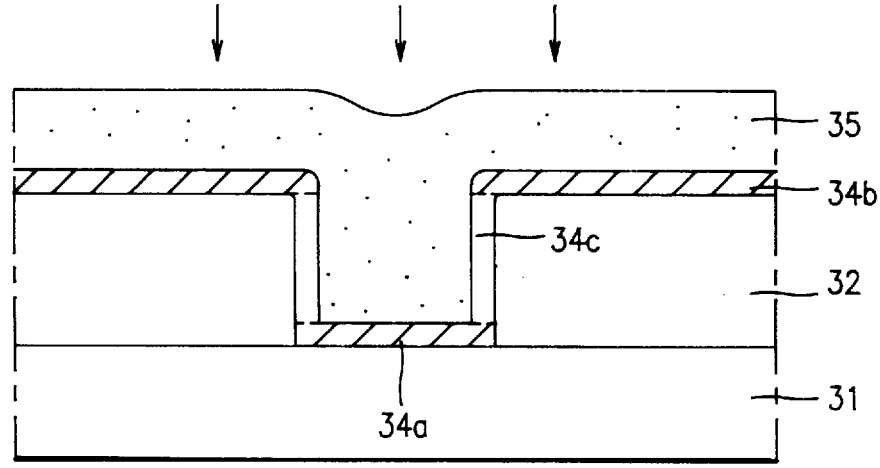

As shown in FIG. 6D, the second insulating film 35 is formed by depositing the insulating material on the active film 34.

Figure 6E:
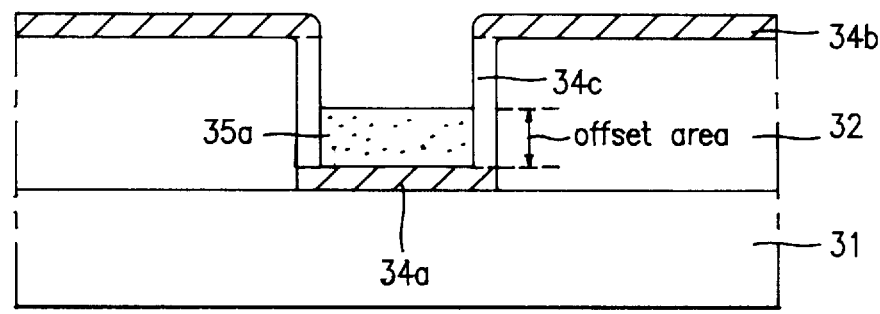

Next, as shown in FIG. 6E, the second insulating film 35 is selectively removed such that only a portion 35a remains at the bottom of the contact hole 33, such that a portion of region 34c in contact with insulating film 35a serves as the offset region. Thus, the length of the offset is determined by the thickness of film 35a. Thus, the offset region is self-aligned in accordance with the thickness of the offset insulating film.

Figure 6F:
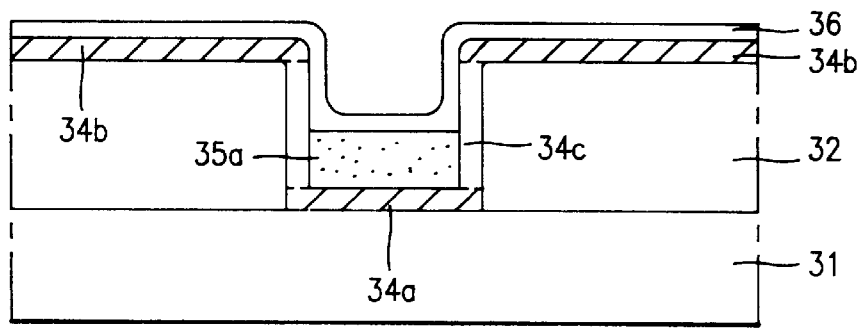
Figure 6G:
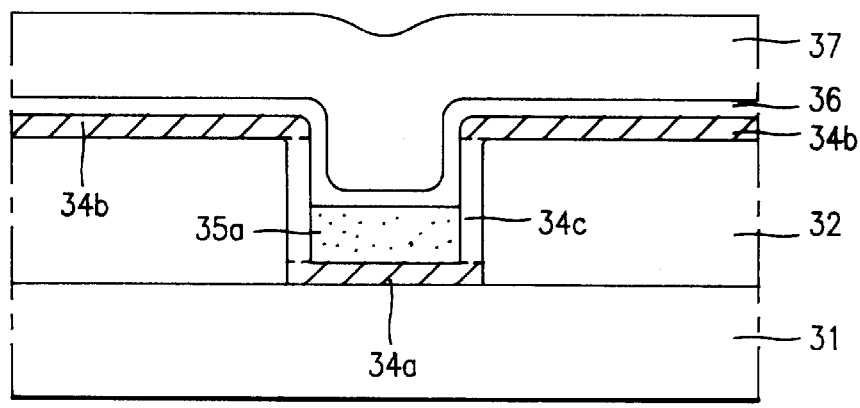

As seen in FIG. 6F, insulating material is deposited on the exposed surface of the semiconductor region 34c including the offset insulating film 35a and the second impurity region 34b to form the third insulating film 36. Metal is then deposited on the third insulating film 36 to form a conductive film 37, as shown in FIG. 6G.

Figure 6H:
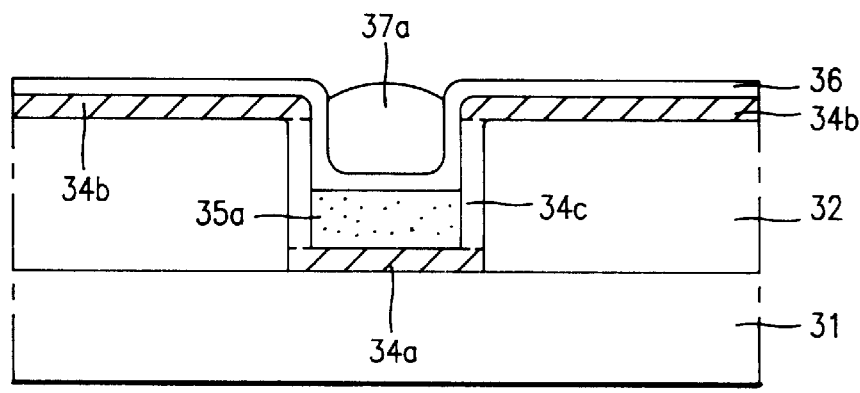

As shown in FIG. 6H, portions of conductive film 37 formed around contact hole 33 are removed, thereby leaving a portion which forms gate electrode 37a.

Figure 7:
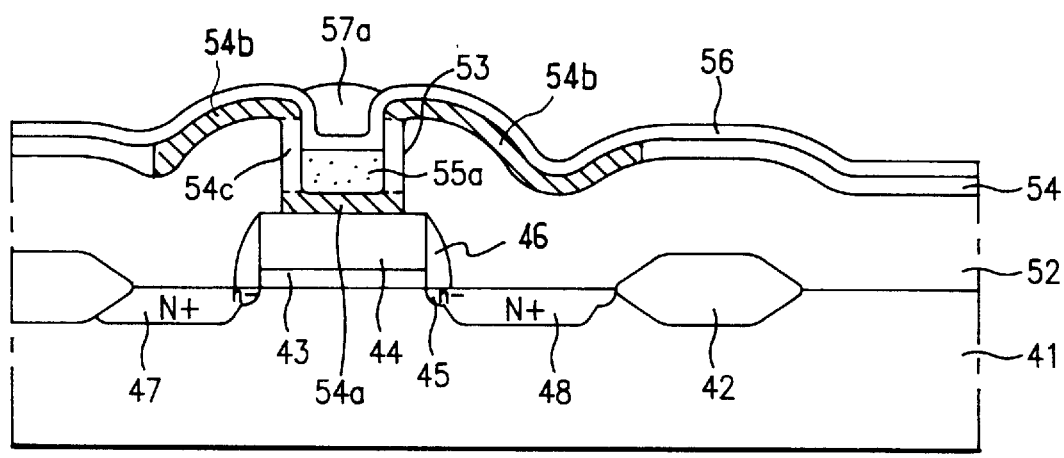
FIG. 7 is a cross sectional view of a static random access memory cell in accordance with a preferred embodiment of the present invention.

As illustrated in FIG. 7, the SRAM cell, according to the present invention, is formed in such a manner that the field oxide film 42 and an active region are formed on the semiconductor substrate 41. The first gate insulating film 43 is formed on the semiconductor substrate 41 of the active region separated from the field oxide film 42. First gate electrode 44 is formed on the first gate insulating film 43 as further shown in FIG. 7.

Sidewall insulative portions 46 are formed on opposing sides of first gate electrode 44, and the first and second impurity regions 47 and 48 are formed in the semiconductor substrate 41 adjacent respective sidewall insulative portions 46. The first insulating film 52 has a contact hole 53, which exposes the first conductive film 44 on the semiconductor substrate 41. The third semiconductor region 54a is formed electrically connected to the first gate electrode 44 at the bottom of the contact hole 53, and the fourth impurity region 54b is formed on the first insulating film 52, except in the contact hole 53. Further, semiconductor region 54c is formed on the sidewall of the contact hole 53.

The second insulating film 55a is formed on the third impurity region 54a inside the contact hole 53 to have a thickness less than the depth of the contact hole 53. The second gate insulating film 56 is formed on the second insulating film 55a, the semiconductor region 54c and the fourth impurity region 54b. The second gate electrode 57a is formed on the third insulating film inside the contact hole 53.

In the SRAM cell, according the present invention, the bulk transistor includes the first gate insulating film 43, the first gate electrode 44, and the first and second impurity regions 47 and 48, respectively. In addition, the thin film transistor includes the third and fourth impurity regions 54a and 54b, the semiconductor region 54c, the second gate insulating film 56 and the second gate electrode 57a. The first gate electrode 44 and the third impurity region 54a connect the bulk transistor with the thin film transistor.

A fabrication method for the semiconductor device according to the invention employable as SRAM cell is described below with reference to FIG. 7.

Firstly, a field oxide film 42, defining a field region and an active region, is formed on a p-type semiconductor substrate 41 using a field oxide process. A metal layer is then deposited on the insulating material corresponding to the active region, but not the field region. The insulating material and the metal are selectively removed using a photolithography process to form the first gate insulating film 43 and the first gate electrode 44. Low concentration impurity ions are then implanted into substrate 41 on opposite sides of the active region using the first gate electrode 44 as a mask. As a result, low concentration impurity LDD regions 45 are formed.

Next, an insulating material is deposited on the entire semiconductor substrate 41 including the first gate electrode 44. The insulating material is then selectively removed so as to remain laterally adjacent the sides of the first gate electrode 44 and the first gate insulating film 43 as sidewall insulating portions 46.

Thereafter, high concentration impurity ions are implanted into the active region of the semiconductor substrate 41 using sidewall insulating portions and the first gate electrode 44 as a mask so that the first and second impurity regions 47 and 48 are formed connected to the low concentration impurity regions 45. Typically, the first impurity region 47 is used for the source region of the bulk transistor and the second impurity region 48 is used for the drain.

Insulating material is next deposited on the first gate electrode 44 and the entire surface of the semiconductor substrate 41 to form the first insulating film 52, portions of which are selectively removed using a photolithography process to form the contact hole 53 exposing part of gate electrode 44.

Polycrystalline silicon is then deposited on the first insulating film 52 including the contact hole 53 to form the active film 54. Impurity ions are then implanted into active film 54 to form the third and fourth impurity regions 54a and 55b, respectively. As seen in FIG. 7, third impurity region 54a is provided at the bottom of contact hole 53 and fourth impurity region 54b is provided on first insulating film 52 outside contact hole 53. Additionally, the semiconductor region 54c is formed in the active film formed on the sidewall of the contact hole 53, namely the part not implanted with impurity ions.

Typically, third impurity region 54a is used for the drain region of the thin film transistor and the fourth impurity region 54b is used for the source region.

Thereafter, the insulating material is deposited on the active film 54, and the insulating material is selectively removed such that a portion 55a remains at the bottom contact hole 53. Preferably, the insulating material is removed using a dry etch.

The second gate insulating film 56 is formed on the semiconductor region 54c including the second insulating film 55a and the first insulating film 52 by depositing an additional metal layer. The metal is then selectively removed such that a portion remains inside contact hole 53 serving as second gate electrode 57a.

The semiconductor device employable in the SRAM cell, according to the present invention, has the following advantages.

First, the length of the offset region of the transistor can be controlled by adjusting the thickness of insulating film 55a without an additional mask. Thus, the offset region can be made uniform across the wafer.

Second, in the semiconductor device according to the present invention, since insulating film 55a is provided in the contact hole without an additional mask, the offset region is self-aligned with the gate electrode, thereby reducing the number of process steps and simplifying manufacture of the device.

Third, in the semiconductor device according to the present invention, because the width of the channel of the transistor is determined by width of the contact hole and the length of the channel of the transistor is determined by the thickness of insulating film 55a in the contact hole, it is possible to fabricate a transistor that is not misaligned and thus yield can be improved.

Fourth, in the semiconductor device according to the present invention, because the body of the transistor including the gate electrode, channel region, and first and second impurity regions are formed inside the contact hole, the lateral component of the size of the transistor is reduced so that the device can be used in a high density memory.

What is claimed is:

1. A semiconductor device comprising:
   a substrate;
   a first insulating layer formed on said substrate and having a contact hole;
   a first impurity region formed on a bottom portion of said contact hole;
   a second impurity region formed on a portion of said first insulating film excluding said contact hole;
   a semiconductor region formed on a sidewall of said contact hole;
   a second insulating film formed on said first impurity region in said contact hole;
   an offset region formed in the semiconductor region adjacent to the second insulating film;
   a third insulating film formed on said second insulating film; and
   a gate electrode formed on said third insulating film.

2. A semiconductor device as defined in claim 1, wherein said first impurity region is a drain region.

3. A semiconductor device as defined in claim 1, wherein said second impurity region is a source region.

4. A semiconductor device as defined in claim 1, wherein said semiconductor region is a channel region.

5. A semiconductor device as defined in claim 4, wherein said channel region is formed substantially perpendicular to said first impurity region and to said second impurity region.

6. A semiconductor device as defined in claim 1, wherein a part of said semiconductor region contacting said second insulating layer is the offset region.

7. A semiconductor device as defined in claim 1, wherein said second insulating film has a thickness less than a depth of said contact hole.

8. A semiconductor device as defined in claim 1, wherein a body of the semiconductor device is formed inside said contact hole.

9. A semiconductor device as defined in claim 8, wherein the body of said semiconductor device is cylindrical.

10. A semiconductor device as defined in claim 1, wherein said second insulating film is formed between the first impurity region and the third insulating film in the contact hole to form the offset region.

11. A semiconductor device comprising:
    a substrate;
    a field region and an active region, spaced from said field region, on said substrate;
    a gate insulating film formed on said active region;
    a first conductive film formed on said gate insulating film and said active region;
    first and second impurity regions formed in said substrate on opposed sides of said first conductive film;
    a first insulating film formed on said substrate and having a contact hole to expose an upper surface of said first conductive film;
    a third impurity region formed on a bottom portion of said contact hole and connected electrically with said first conductive film;
    a fourth impurity region formed on said first insulating film;
    a semiconductor region formed on a sidewall of said contact hole;
    a second insulating film formed on said third impurity region inside said contact hole, said film having a thickness less than a depth of said contact hole;
    a third insulating film formed on said second insulating film, said semiconductor region and said fourth impurity region; and
    a second conductive film formed on said third insulating film inside said contact hole.

12. A semiconductor device as defined in claim 11, wherein said gate insulating film, said first conductive film, and said first and second impurity regions form a bulk transistor.

13. A semiconductor device as defined in claim 11, wherein said third and fourth impurity regions, said semiconductor region, said third insulating film and said second conductive film form a thin film transistor.

* * * * *